US012027516B1

(12) United States Patent
Liu et al.

(10) Patent No.: US 12,027,516 B1
(45) Date of Patent: Jul. 2, 2024

(54) GAN POWER SEMICONDUCTOR DEVICE INTEGRATED WITH SELF-FEEDBACK GATE CONTROL STRUCTURE

(71) Applicant: SOUTHEAST UNIVERSITY, Nanjing (CN)

(72) Inventors: Siyang Liu, Nanjing (CN); Sheng Li, Nanjing (CN); Chi Zhang, Nanjing (CN); Weifeng Sun, Nanjing (CN); Mengli Liu, Nanjing (CN); Yanfeng Ma, Nanjing (CN); Longxing Shi, Nanjing (CN)

(73) Assignee: SOUTHEAST UNIVERSITY, Nanjing (CN)

( * ) Notice: Subject to any disclaimer, the term of this patent is extended or adjusted under 35 U.S.C. 154(b) by 0 days.

(21) Appl. No.: 18/568,277

(22) PCT Filed: Dec. 29, 2022

(86) PCT No.: PCT/CN2022/143265
§ 371 (c)(1),
(2) Date: Dec. 8, 2023

(87) PCT Pub. No.: WO2023/236525
PCT Pub. Date: Dec. 14, 2023

(30) Foreign Application Priority Data

Jun. 8, 2022 (CN) .......................... 202210643562.2

(51) Int. Cl.
*H01L 29/778* (2006.01)
*H01L 27/06* (2006.01)
(Continued)

(52) U.S. Cl.
CPC .......... *H01L 27/0629* (2013.01); *H01L 28/20* (2013.01); *H01L 29/2003* (2013.01); *H01L 29/7786* (2013.01); *H01L 29/7787* (2013.01)

(58) Field of Classification Search
None
See application file for complete search history.

(56) References Cited

U.S. PATENT DOCUMENTS

2013/0240951 A1    9/2013   Bedell et al.
2020/0135722 A1*   4/2020   Chern ............... H01L 29/66462
(Continued)

FOREIGN PATENT DOCUMENTS

CN    110649096 A    1/2020
CN    111095531 A    5/2020
CN    114864687 A    8/2022

*Primary Examiner* — Grant S Withers
(74) *Attorney, Agent, or Firm* — Bayramoglu Law Offices LLC

(57) ABSTRACT

A GaN power semiconductor device integrated with a self-feedback gate control structure comprises a substrate, a buffer layer, a channel layer and a barrier layer. A gate control area is formed by a first metal source electrode, a first P-type GaN cap layer, a first metal gate electrode, a first metal drain electrode, a second P-type GaN cap layer and a second metal gate electrode. An active working area is formed by the first metal source electrode, a third P-type GaN cap layer, a third metal gate electrode, a second metal drain electrode, the second P-type GaN cap layer and a second metal source electrode. The overall gate leaking current of the device is regulated by the gate control area, the integration level is high, the parasitic effect is small, and the charge-storage effect can be effectively relieved, thus improving the threshold stability of the device.

7 Claims, 10 Drawing Sheets

(51) Int. Cl.
 *H01L 29/20* (2006.01)
 *H01L 49/02* (2006.01)

(56) References Cited

U.S. PATENT DOCUMENTS

2020/0161463 A1* 5/2020 Chern .................. H01L 29/205
2020/0227543 A1  7/2020 Soman et al.
2020/0287536 A1* 9/2020 Udrea .................. H03K 17/102
2022/0367698 A1* 11/2022 Hwang ............... H01L 23/3171

* cited by examiner

GAN POWER SEMICONDUCTOR DEVICE INTEGRATED WITH SELF-FEEDBACK GATE CONTROL STRUCTURE

CROSS REFERENCE TO THE RELATED APPLICATIONS

This application is the national phase entry of International Application No. PCT/CN2022/143265, filed on Dec. 29, 2022, which is based upon and claims priority to Chinese Patent Application No. 202210643562.2, filed on Jun. 8, 2022, the entire contents of which are incorporated herein by reference.

BACKGROUND OF THE INVENTION

1. Technical Field

The invention relates to the field of power semiconductor devices, in particular to a GaN power semiconductor device integrated with a self-feedback gate control structure.

2. Description of Related Art

Gallium nitride (GaN), as one of the representatives of the third-generation wide bandgap semiconductors, has the characteristics of broad bandgap, high critical electric field and high heat conductivity, thus being widely demanded in power switch devices. With a GaN power device with AlGaN/GaN lateral heterojunctions as an example, two-dimensional electron gas (2DEG) with a high electron mobility and a high saturated electron drift speed will be produced on the interface of the AlGaN/GaN lateral heterojunctions in a case of unintentional doping, and high-electron-mobility transistors (HEMTs) prepared based on the AlGaN/GaN lateral heterojunction structure can be applied to high-frequency, high-voltage, high-temperature and other fields.

Because the 2DEG produced on the interface of the AlGaN/GaN lateral heterojunctions cannot be depleted easily under common conditions, existing GaN devices based on the AlGaN/GaN lateral heterojunction structure are generally normally-on devices. Considering the safety in use of power devices, the power devices are often designed to be normally-off. For traditional GaN devices based on a Schottky gate structure and provided with a P-type GaN cap layer, Schottky contact is equivalent to a reverse-biased diode and a PIN structure is formed between the P-type GaN cap layer and a channel layer, which is equivalent to the existence of a pair of back-to-back diodes in the traditional GaN devices based on the Schottky gate structure, the devices may be turned on and off repeatedly or operate continuously due to the charge-storage effect, electrons sensed in the P-type GaN cap layer cannot be released in time, and the electrons stored in the P-type GaN cap layer need to be depleted before the devices are turned on next time, making the threshold voltage of the devices unstable; a positive drift of the threshold voltage will lead to an increase the on-resistance of the devices; and a negative drift of the threshold voltage will lead to mistaken turn-on of the devices. Therefore, the instability of the threshold voltage will result in a series of reliability problems in system application of the devices, limit the use of the devices in high-frequency switching, and exert a negative influence on electrical parameters and properties of the devices. Traditional GaN devices based on the Schottky gate structure have the defects of excessive gate leaking current, which severely compromises the operating stability of the devices in a high gate voltage condition.

BRIEF SUMMARY OF THE INVENTION

Technical Problem: In view of the problem of instable threshold voltage and large gate leaking current of AlGaN/GaN HEMT devices in actual use, the invention provides a GaN power semiconductor device integrated with a self-feedback gate control structure. The threshold stability of the device can be effectively improved, and the overall gate leaking current of the device can be regulated through the self-feedback gate control structure.

Technical solution: The technical solution adopted by the GaN power semiconductor device integrated with a self-feedback gate control structure provided by the invention is as follows:

The GaN power semiconductor device integrated with a self-feedback gate control structure structurally comprises a substrate, a buffer layer, a channel layer and a barrier layer which are stacked from bottom to top, a heterojunction channel with a high electron mobility is generated between the channel layer and the barrier layer due to a polarization effect, and a gate control area and an active working area are disposed on an upper surface of the barrier layer;
  wherein, in the gate control area, a first metal source electrode, a first P-type GaN cap layer, a first metal drain electrode and a second P-type GaN cap layer are sequentially arranged on the upper surface of the barrier layer at intervals, wherein a first metal gate electrode is arranged on an upper surface of the first P-type GaN cap layer, a second metal gate electrode is arranged on an upper surface of the second P-type GaN cap layer, the first metal source electrode and the first P-type GaN cap layer are connected through a first resistance region, the first P-type GaN cap layer and the second P-type GaN cap layer are connected through a second resistance region, and the first metal drain electrode and the second P-type GaN cap layer are connected through a third resistance region;
  in the active working area, the first metal source electrode, a third P-type GaN cap layer, a second metal drain electrode, the second P-type GaN cap layer and a second metal source electrode are sequentially arranged on the upper surface of the barrier layer at intervals, wherein a third metal gate electrode is arranged on an upper surface of the third P-type GaN cap layer, and a second metal gate electrode is arranged on an upper surface of the second P-type GaN cap layer;
  the gate control area and the active working region share the first metal source electrode, the first metal drain electrode in the gate control area is connected with the third metal gate electrode in the active working area through a connecting metal, and the gate control area and the active working area share the second P-type GaN cap layer and the second metal gate electrode.

The first metal gate electrode is in Schottky contact with the first P-type GaN cap layer, the second metal gate electrode is in Schottky contact with the second P-type GaN cap layer, the third metal gate electrode is in ohmic contact with the third P-type GaN cap layer, and the first metal source electrode, the second metal source electrode, the first metal drain electrode and the second metal drain electrode are in ohmic contact with the barrier layer.

The first metal source electrode, the first metal gate electrode and the first metal drain electrode in the gate control area form a Schottky gate-contact type enhancement-mode GaN transistor; and the first metal source electrode, the third metal gate electrode and the second metal drain electrode in the active working area form an ohmic gate-contact type GaN transistor, and the second metal drain electrode, the second metal gate electrode and the second metal source electrode form a Schottky gate-contact type GaN transistor.

The first resistance region, the second resistance region and the third resistance region are one or more of a high-electron mobility resistor, a dielectric resistor and a drift-region bulk resistor formed by the heterojunction channel, and is in one or more of an S shape, a hollow-square shape and a linear shape.

A resistance of the first resistance region, the second resistance region and the third resistance region is regulated by changing a length-width ratio of the resistance regions; the third resistance region is configured to regulate an overall leaking current of the device and has a resistance of 1 mΩ-1 kΩ; and a resistance ratio of the first resistance region to the second resistance region is used to regulate a turn-on voltage of the Schottky gate-contact type enhancement-mode GaN transistor in the gate control area to decrease a gate voltage of the third metal gate electrode under a high gate voltage, thus realizing self-feedback control of a gate leakage.

The first metal gate electrode and the second metal gate electrode in the gate control area adopt a same process, a gate width and gate length of the first metal gate electrode are 1 μm-100 μm, and a gate length of the second metal gate electrode is 1000 μm-100000 μm.

A Schottky contact type depletion-mode GaN transistor is formed in the gate control area.

In the invention, the gate voltage of the Schottky gate-contact type enhancement-mode GaN transistor in the gate control area is regulated by the first resistance region and the second resistance region, which is expressed as $$V_{8a} = \frac{R_{10a}}{R_{10a} + R_{10b}} V_{8b}$$

and further expressed as $$V_{8a} = \frac{1}{1 + \frac{R_{10b}}{R_{10a}}} V_{8b}.$$

When $V_{8a}$ is less than the threshold of the Schottky gate-contact type enhancement-mode GaN transistor in the gate control area, the Schottky gate-contact type enhancement-mode GaN transistor in the gate control area is turned off, and the gate potential of the ohmic gate-contact type GaN transistor in the active working area is basically equal to the gate potential of the Schottky gate-contact type GaN transistor in the active working area, such that electric charges are released to relieve the charge-storage effect, thus improving the threshold stability of the device. When $V_{8a}$ is greater than the threshold of the Schottky gate-contact type enhancement-mode GaN transistor in the gate control area, the Schottky gate-contact type enhancement-mode GaN transistor in the gate control area is turned on, the gate potential of the ohmic gate-contact type GaN transistor in the active working area is pulled down, such that only the Schottky gate-contact type GaN transistor in the active working area works in a normally on state, thus effectively reducing the gate leaking current of the device.

The gate potential of the ohmic gate-contact type GaN transistor may be expressed as $$V_{8c} = \frac{R_M}{R_M + R_{10c}} V_{8b},$$

where $R_M$ represents the channel resistance of the Schottky gate-contact type enhancement-mode GaN transistor in the gate control area. Further, the gate potential of the ohmic gate-contact type GaN transistor in the active working area may be expressed as $$V_{8c} = \frac{1}{1 + \frac{R_{10c}}{R_M}} V_{8b},$$

and the value of $R_M$ changes with the on or off state of the Schottky gate-contact type enhancement-mode GaN transistor in the gate control area.

Beneficial Effects: Compared with the prior art, the invention has the following beneficial effects;

The threshold stability is improved. The device provided by the invention integrates the advantages of the Schottky gate structure and the ohmic gate structure; when the gate voltage of the Schottky gate-contact type enhancement-mode GaN transistor in the gate control area is less than the threshold voltage of the enhancement-mode GaN transistor, the ohmic gate-contact type GaN transistor structure in the active working area is used to assist in releasing charges stored in the P-type GaN cap layers to effectively relieve the charge-storage effect, thus improving the threshold stability.

The gate leaking current is reduced. Compared with traditional devices based on the ohmic structure, the invention adopts a gate structure formed by connecting an ohmic gate and Schottky gate, thus effectively reducing the gate leaking current of the device; moreover, the self-feedback gate control structure ensures that only the Schottky gate-contact type GaN transistor in the active working area works when the gate voltage of the Schottky gate-contact type enhancement-mode GaN transistor in the gate control area is greater than the threshold voltage of the enhancement-mode GaN transistor, thus further reducing the gate leaking current; the gate leaking current is controlled not to be greater than a set maximum value, such that the maximum gate leaking current can be regulated by controlling the resistance of the third resistance region.

The integration level is high, and the parasitic effect is small. The first metal gate electrode in the gate control area and the second metal gate electrode in the active working area adopt the same process, thus lowering the process difficulty. The connection relation between the gate control area and the active working area makes the device have a high integration level and reduces the negative impact of the parasitic effect of the gate part on the device in actual application.

The reliability of the device is improved, and the turn-on power of the device is reduced. When the GaN device is turned on, a large quantity of holes can be injected into the barrier layer from the P-type GaN cap layers through an ohmic gate to allow electrons captured by electron traps to be released when the device is turned on, such that the dynamic resistance of the device is optimized, and the reliability of the device is improved. Moreover, a Schottky gate overcomes the defect of high power consumed for continuously maintaining the current when a GaN device only with an ohmic gate is turned on.

BRIEF DESCRIPTION OF THE SEVERAL VIEWS OF THE DRAWINGS

FIGS. 8B and 8C illustrate an equivalent schematic diagram of the structure in FIG. 8A, wherein FIG. 8B illustrates an equivalent schematic diagram when a negative voltage applied to a gate of a Schottky gate-contact type GaN transistor in an active working area B, namely $-V_{8b}$, is greater than a threshold voltage of a Schottky gate-contact type depletion-mode GaN transistor in a gate control area A; FIG. 8C illustrates an equivalent schematic diagram of the structure in FIG. 8A, wherein FIG. 8B illustrates an equivalent schematic diagram when the negative voltage applied to the gate of the Schottky gate-contact type GaN transistor in the active working area B, namely $-V_{8b}$, is greater than the threshold voltage of the Schottky gate-contact type depletion-mode GaN transistor in the gate control area A.

DETAILED DESCRIPTION OF THE INVENTION

Figure 1:
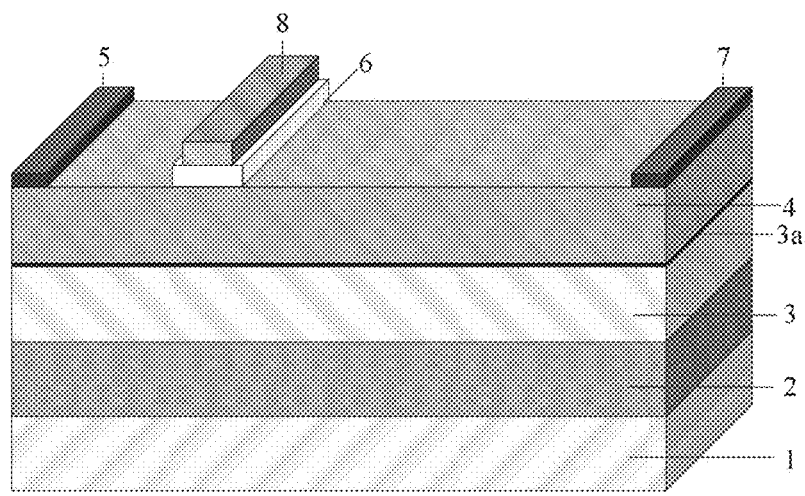
FIG. 1 illustrates a structural diagram and an equivalent circuit diagram of a traditional GaN device with a P-type GaN cap layer.
Figure 2:
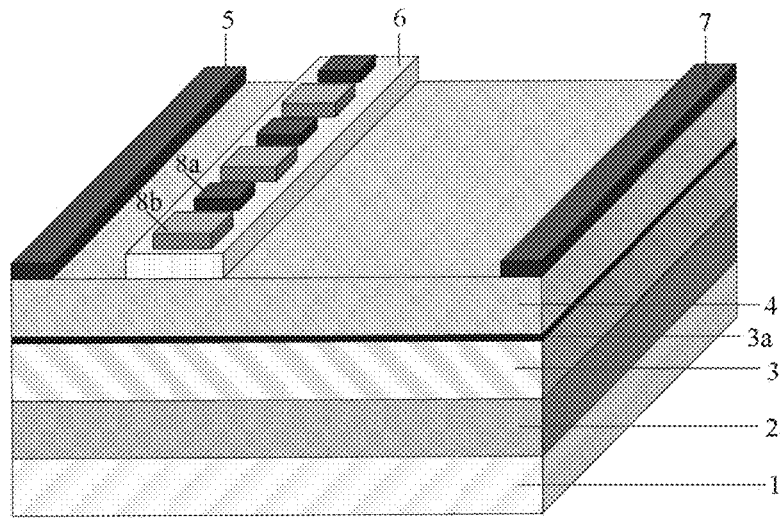
FIG. 2 illustrates a structural diagram and an equivalent circuit diagram of a traditional GaN device with a hybrid gate structure.
Figure 3A:
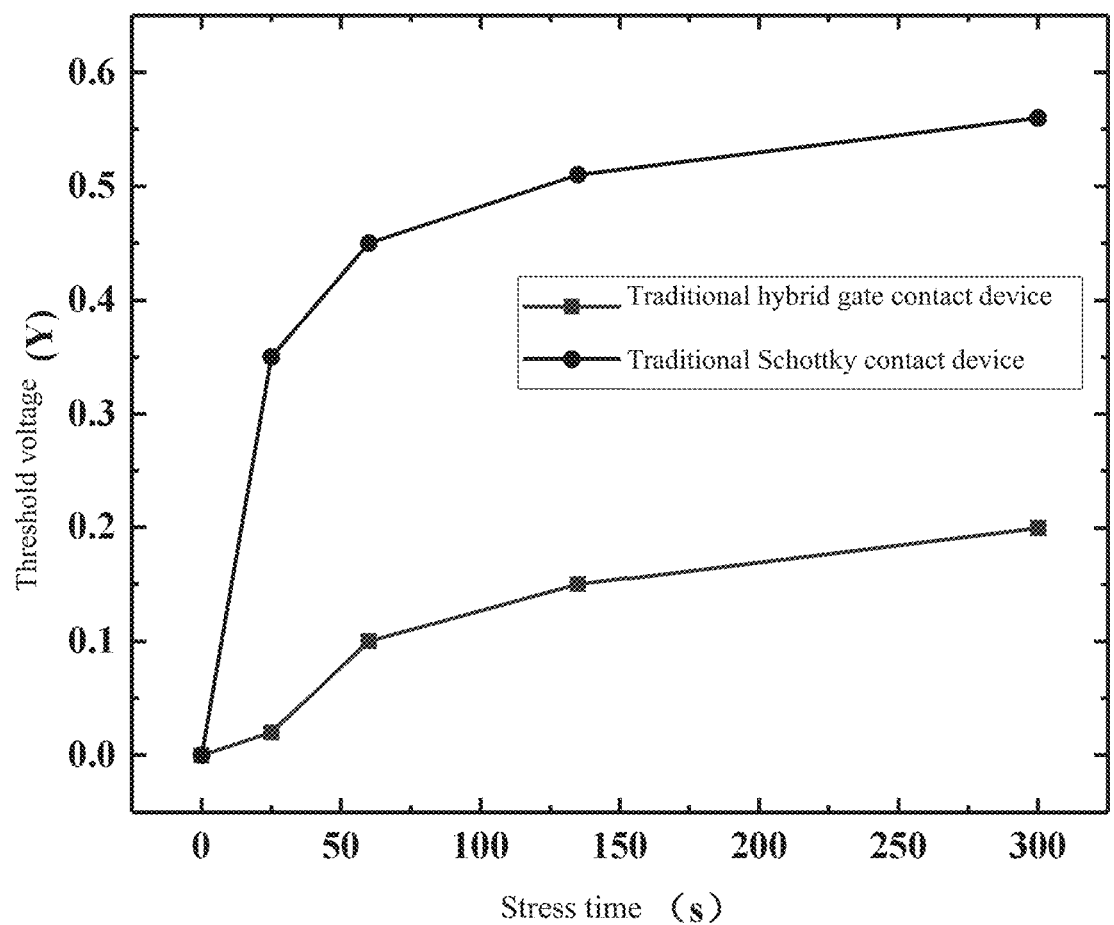
FIG. 3A illustrates a threshold voltage comparison diagram of the traditional GaN device and the traditional GaN device with the hybrid gate structure under stress.
Figure 3B:
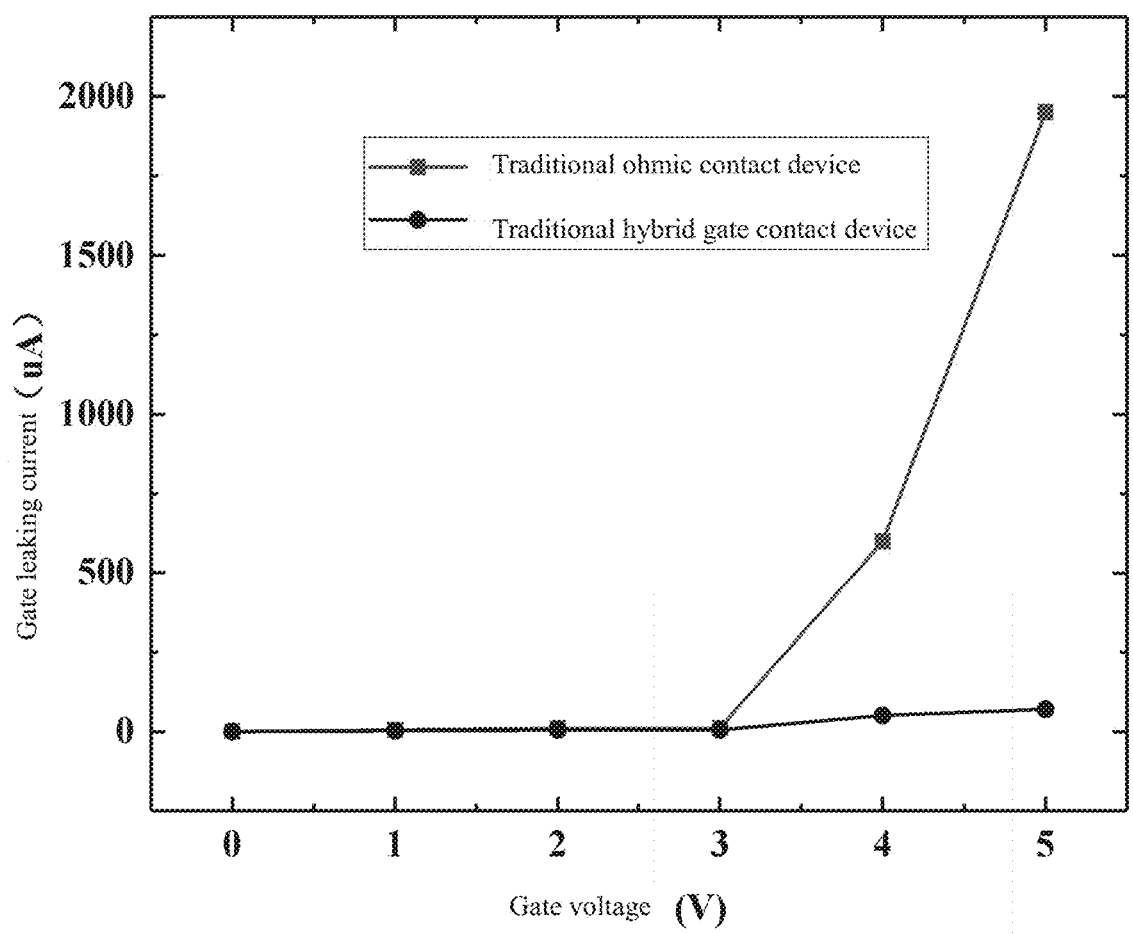
FIG. 3B illustrates a gate leaking current comparison diagram under different gate voltages.
Figure 4:
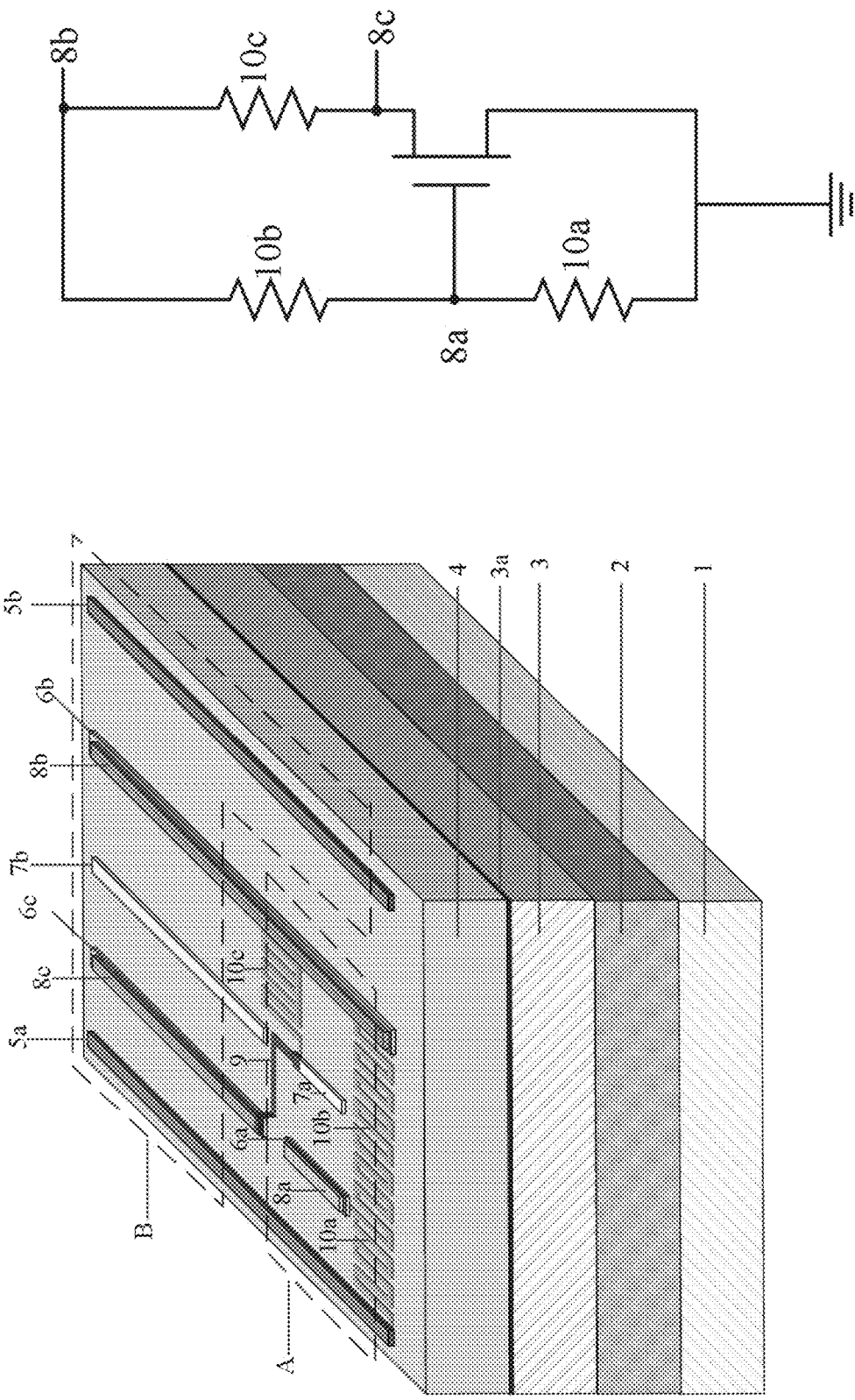
FIG. 4 illustrates a structural diagram and an equivalent circuit diagram of a GaN power semiconductor device integrated with a self-feedback gate control structure according to the invention.

The invention will be described in further detail below in conjunction with accompanying drawings and specific embodiments.

Embodiment 1

A GaN power semiconductor device integrated with a self-feedback gate control structure comprises a substrate 1, a buffer layer 2, a channel layer 3 and a barrier layer 4 which are stacked from bottom to top, wherein a heterojunction channel 3a with a high electron mobility is generated between the channel layer 3 and the barrier layer 4 due to a polarization effect, and a gate control area A and an active working area B are disposed on an upper surface of the barrier layer 4;

In the gate control area A, a first metal source electrode 5a, a first P-type GaN cap layer 6a, a first metal drain electrode 7a and a second P-type GaN cap layer 6b are sequentially arranged on the upper surface of the barrier layer 4 at intervals, wherein a first metal gate electrode 8a is arranged on an upper surface of the first P-type GaN cap layer 6a, a second metal gate electrode 8b is arranged on an upper surface of the second P-type GaN cap layer 6b, the first metal source electrode 5a and the first P-type GaN cap layer 6a are connected through a first resistance region 10a, the first P-type GaN cap layer 6a and the second P-type GaN cap layer 6b are connected through a second resistance region 10b, and the first metal drain electrode 7a and the second P-type GaN cap layer 6b are connected through a third resistance region 10c;

In the active working area B, the first metal source electrode 5a, a third P-type GaN cap layer 6c, a second metal drain electrode 7b, the second P-type GaN cap layer 6b and a second metal source electrode 5b are sequentially arranged on the upper surface of the barrier layer 4 at intervals, wherein a third metal gate electrode 8c is arranged on an upper surface of the third P-type GaN cap layer 6c, and a second metal gate electrode 8b is arranged on an upper surface of the second P-type GaN cap layer 6b;

The gate control area A and the active working region B share the first metal source electrode 5a, the first metal drain electrode 7a in the gate control area A is connected with the third metal gate electrode 8c in the active working area B through a connecting metal 9, and the gate control area A and the active working area B share the second P-type GaN cap layer 6b and the second metal gate electrode 8b.

Figure 5A:
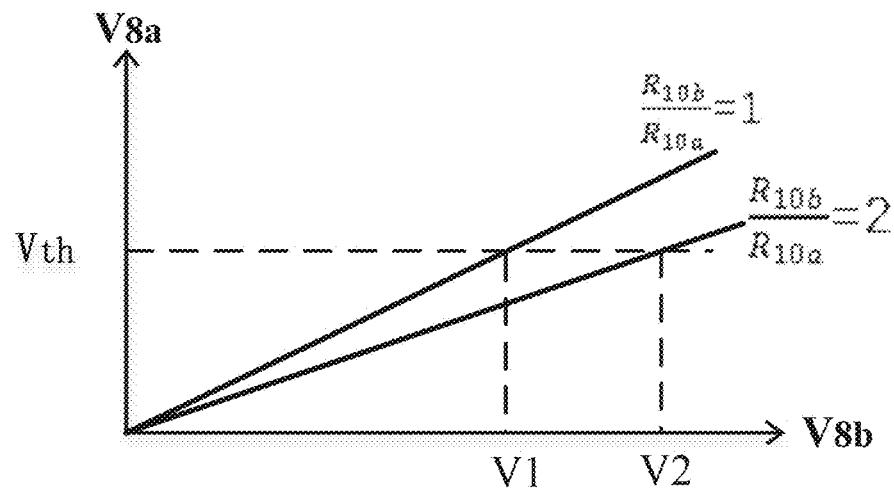
FIG. 5A illustrates the ratio of a first resistance region and a second resistance region according to the invention.
Figure 5B:
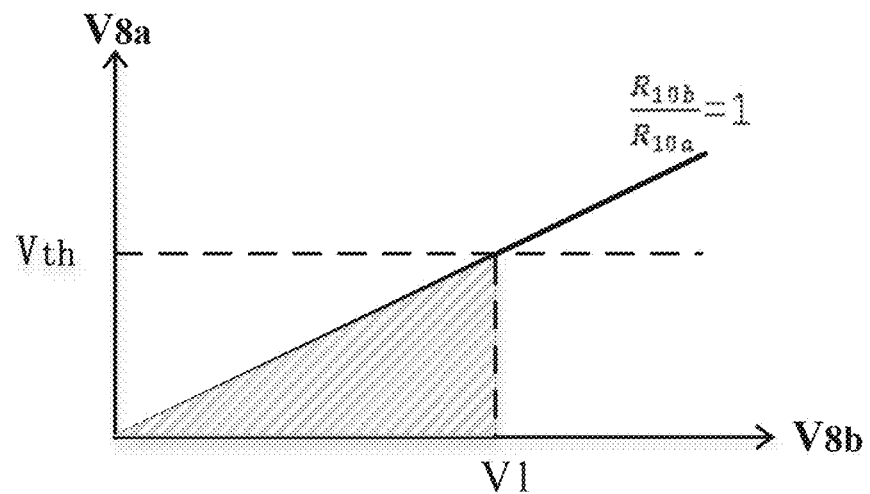
FIG. 5B illustrates the regulation effect of the ratio on a turn-on voltage of a Schottky gate-contact type enhancement-mode GaN transistor in a gate control area, wherein the vertical coordinate Vth is a threshold of the enhancement-mode GaN transistor in the gate control area.
Figure 6A:
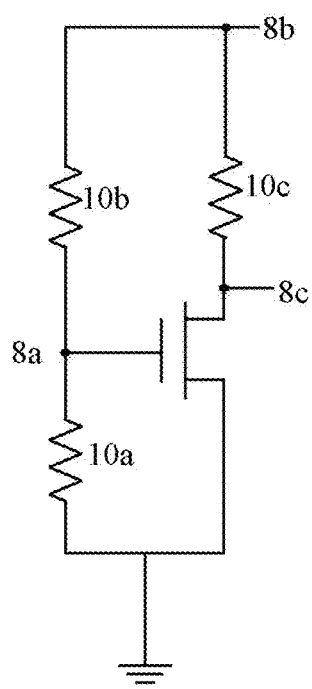
FIG. 6A illustrates an equivalent circuit diagram of the Schottky gate-contact type enhancement-mode GaN transistor in the gate control area.
Figure 6B:
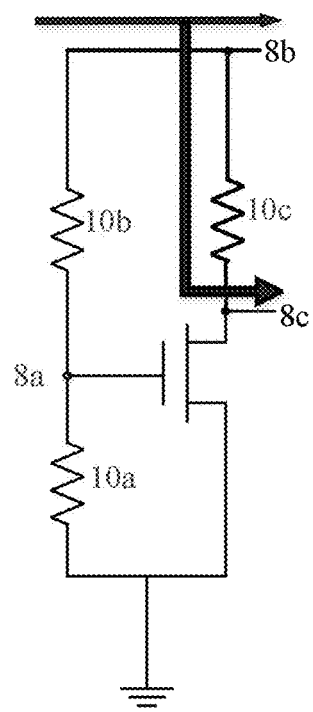
FIG. 6B illustrates an equivalent schematic diagram when $V_{8a}$ is less than the threshold of the Schottky gate-contact type enhancement-mode GaN transistor in the gate control area.
Figure 6C:
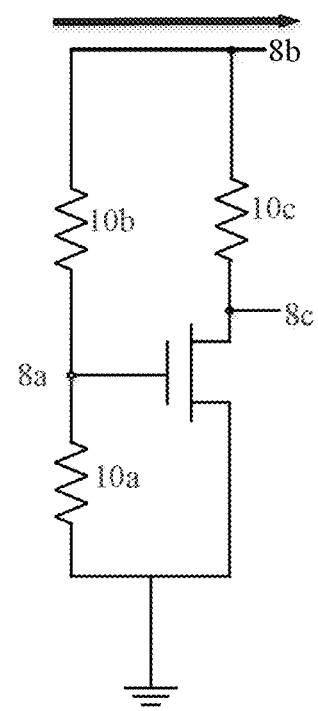
FIG. 6C illustrates an equivalent schematic diagram when $V_{8a}$ is greater than the threshold of the Schottky gate-contact type enhancement-mode GaN transistor in the gate control area.
Figure 7A:
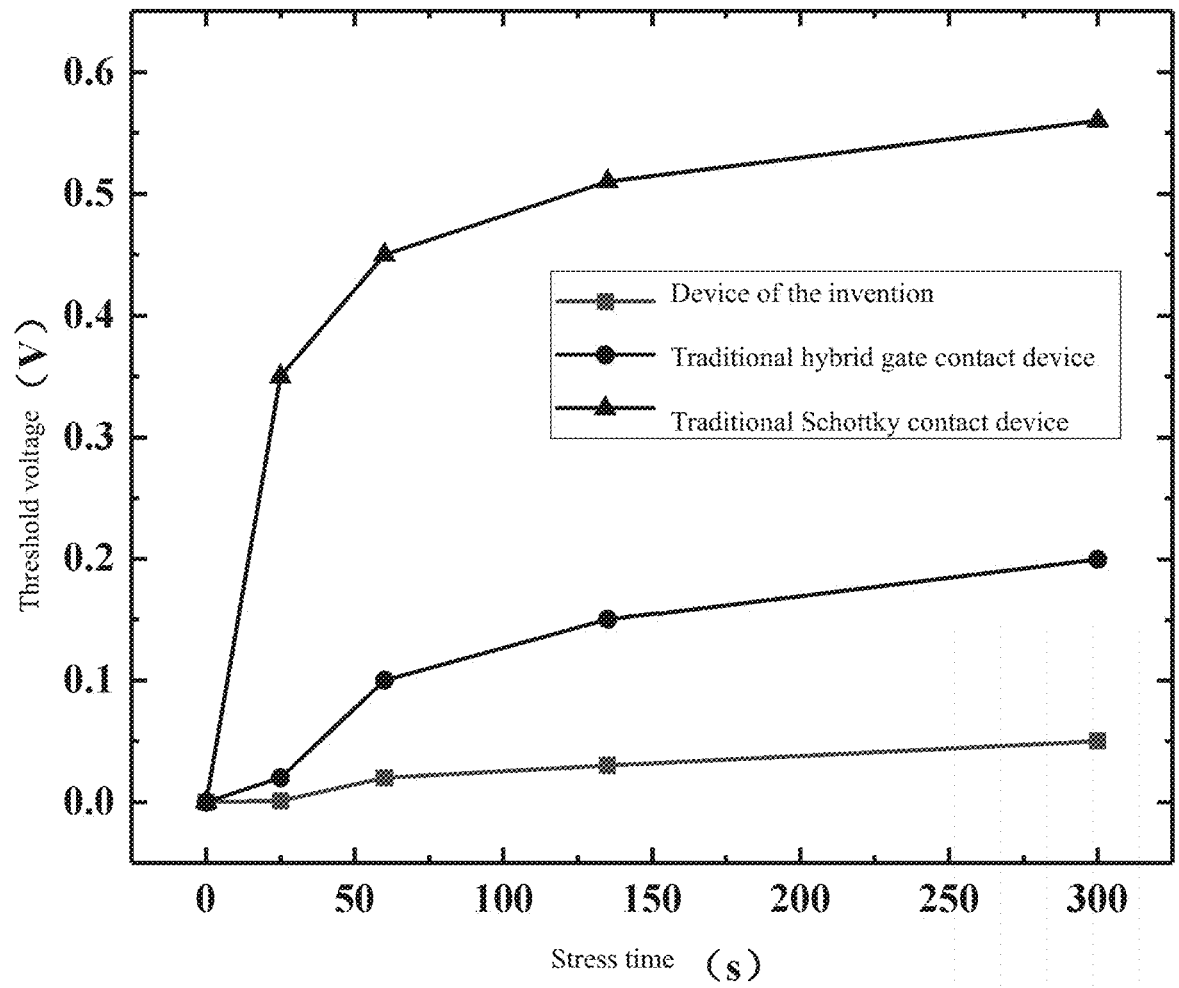
FIG. 7A illustrates a threshold voltage comparison diagram of the invention, a traditional Schottky gate-contact type GaN device and a traditional hybrid gate-contact type GaN device under stress.
Figure 7B:
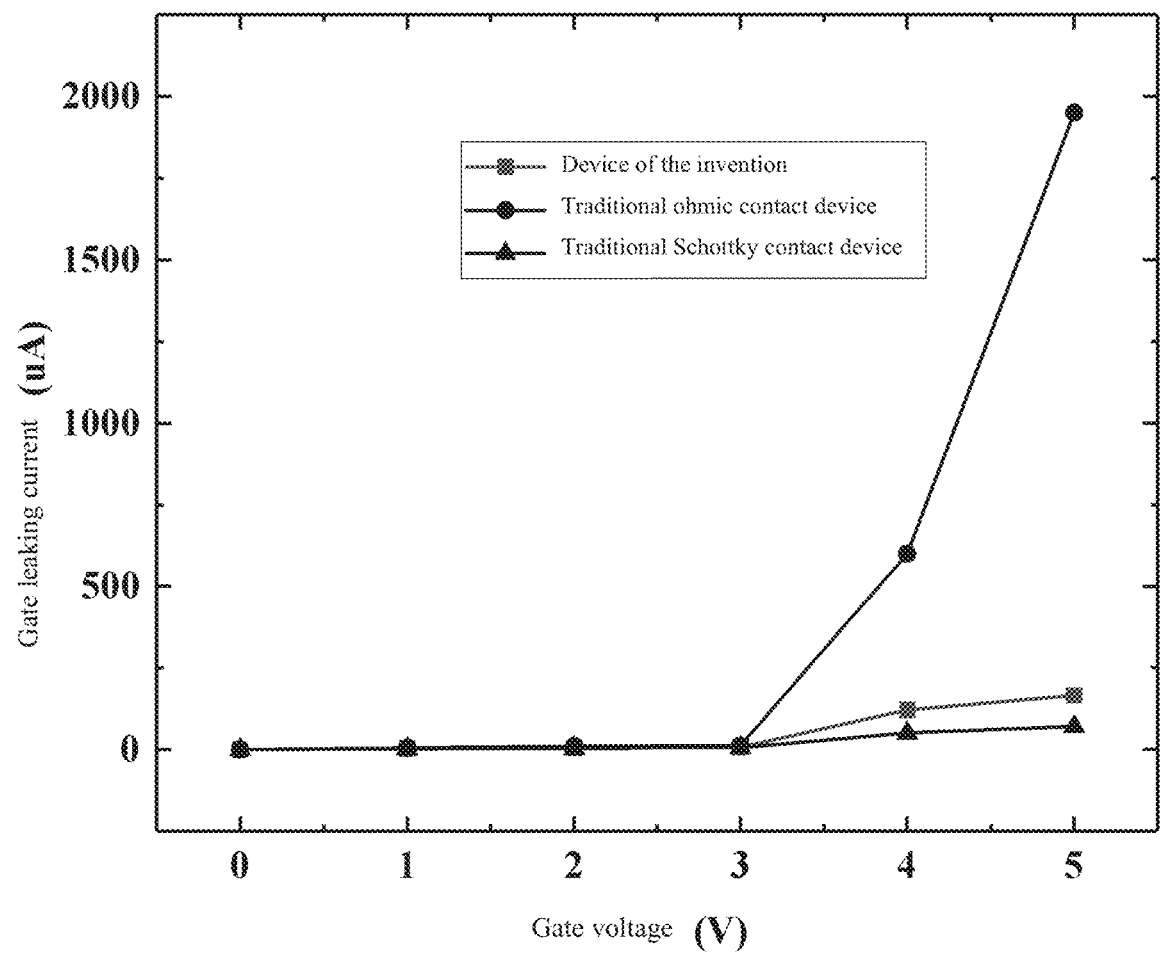
FIG. 7B illustrates a gate leaking current comparison diagram of the invention, a traditional ohmic gate-contact type GaN device and the traditional Schottky gate-contact type GaN device under different gate voltages, which indicates that the invention has high threshold stability and a small gate leaking current under the same condition.

FIGS. 5A and 5B illustrate the ratio of the first resistance region 10a to the second resistance region 10b in the gate control area A and the regulation effect of the ratio on the turn-on voltage of a Schottky gate-contact type enhancement-mode GaN transistor in the gate control area A, which in turn realizes self-feedback gate control. For example, in a case of $R_{10b}/R_{10a}=1$, when the gate voltage of a Schottky gate-contact type GaN transistor in the active working area B is less than the turn-on voltage of the Schottky gate-contact type enhancement-mode GaN transistor in the gate control area A, as shown by the dashed area in FIG. 5B, an ohmic gate-contact type GaN transistor in the active working area B and the Schottky gate-contact type GaN transistor in the active working area B work at the same time. When the gate voltage of the Schottky gate-contact type GaN transistor in the active working area B is greater than the turn-on voltage V1 of the Schottky gate-contact type enhancement-mode GaN transistor in the gate control area A, as shown by the area on the right of the dashed area, only the Schottky gate-contact type GaN transistor in the active working area B works. In this way, the turn-on voltage V1 of the Schottky gate-contact type enhancement-mode GaN transistor in the gate control area A can be regulated by controlling the ratio $R_{10b}/R_{10a}$, thus realizing self-feedback gate control.

Embodiment 2

Figure 8A:
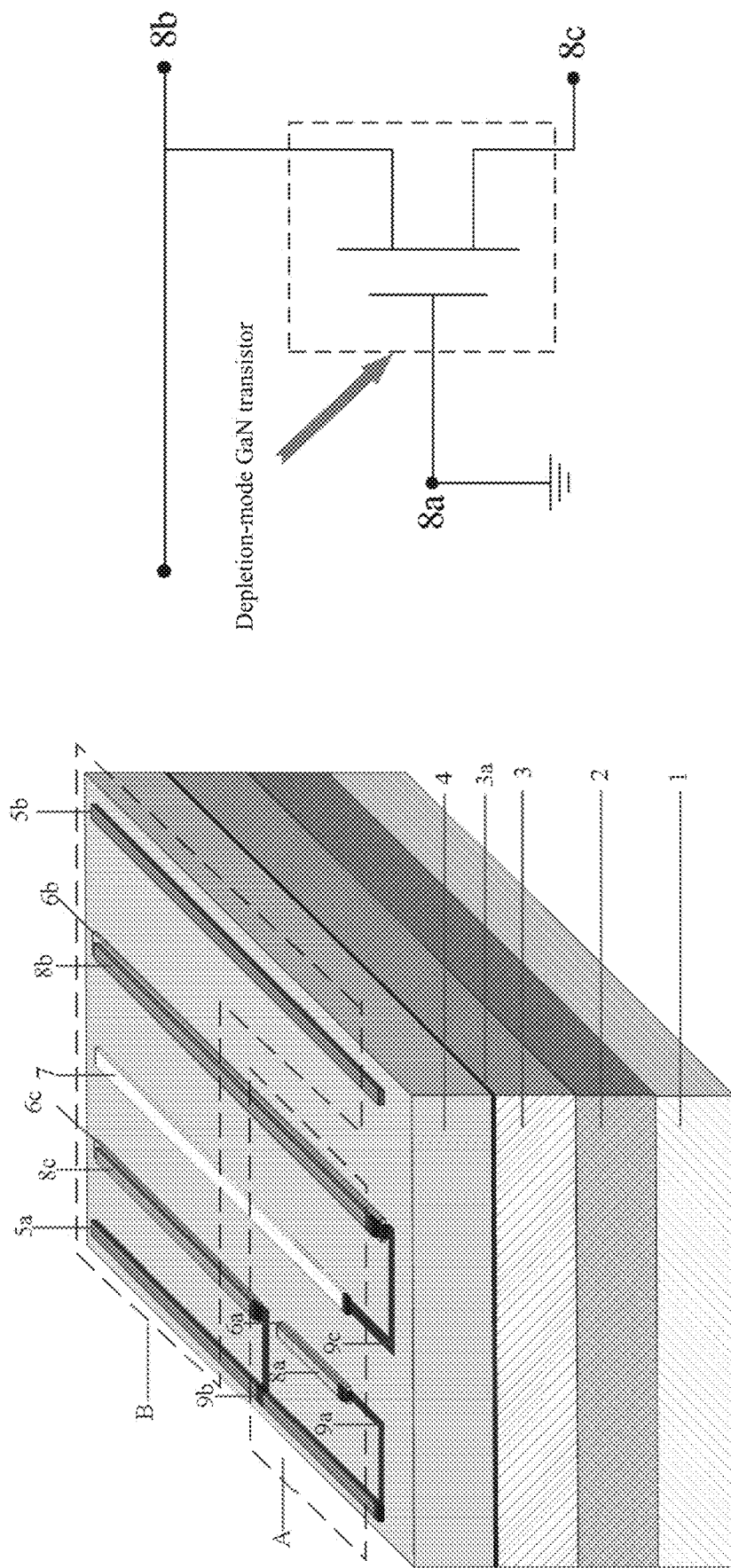
FIG. 8A illustrates a structural diagram of a GaN power semiconductor device integrated with a self-feedback gate control structure according to another embodiment of the invention.

Based on the structure in Embodiment 1, in this embodiment, a Schottky gate-contact type depletion-mode GaN transistor is formed in the gate control area A; referring to FIG. 8A, the first metal gate electrode 8a is connected with the first metal source electrode 5a through a connecting metal 9a, the first metal source electrode 5a is connected with the third metal gate electrode 8c in the active working area B through a connecting metal 9b, and the metal drain electrode 7 is connected with the second metal gate electrode 8b in the active working area B through a connecting metal 9c. Different from Embodiment 1, the threshold of the device in this embodiment is directly regulated by the threshold of the Schottky gate-contact type depletion-mode GaN transistor in the gate control area A, and no resistance region is needed.

Figure 8C:
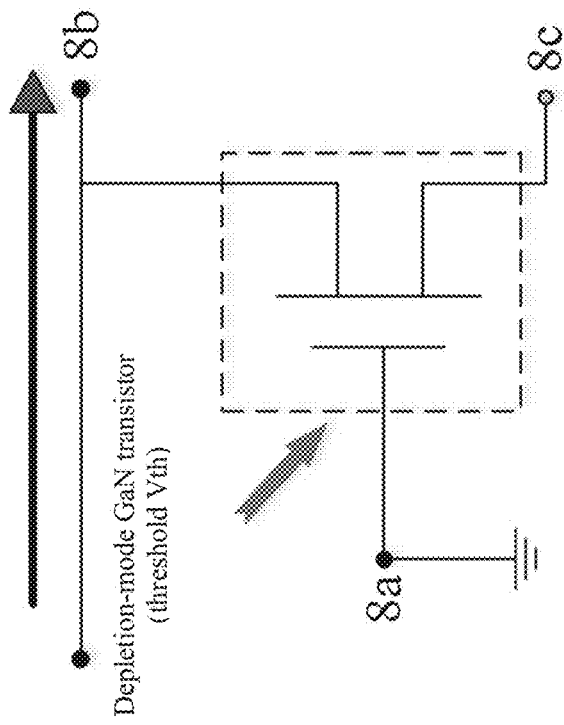
Figure 8B:
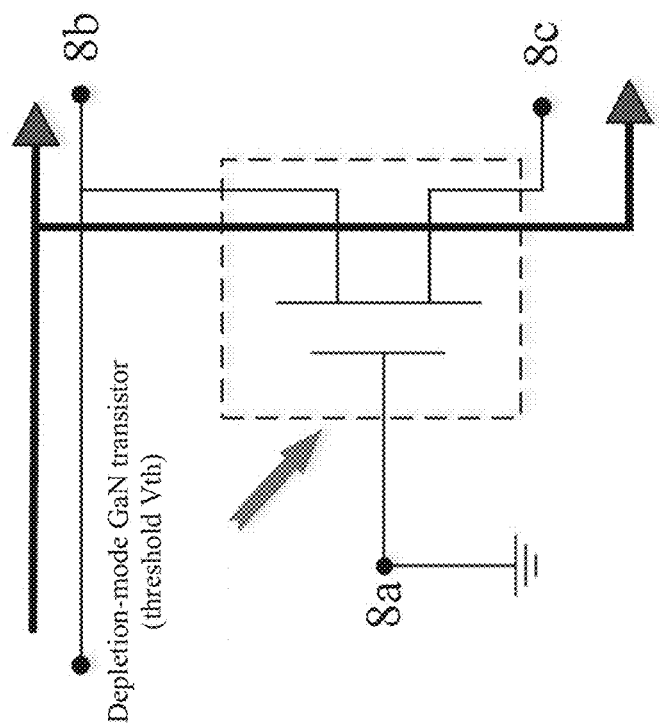

To gain a better understanding of the device in this embodiment, FIGS. 8B and 8C illustrate a schematic circuit diagram of the device under different working conditions in this embodiment. When a negative voltage applied to a gate of the Schottky gate-contact type GaN transistor in the active working area B is greater than the threshold voltage of the Schottky gate-contact type depletion-mode GaN transistor in the gate control area A, as shown by FIG. 8B, the depletion-mode GaN transistor is turned on, and the Schottky gate-contact type GaN transistor in the active working area B and the ohmic gate-contact type GaN transistor in the active working area B work at the same time. When the negative voltage applied to the gate of the Schottky gate-contact type GaN transistor in the active working area B is less than the threshold voltage of the Schottky gate-contact type depletion-mode GaN transistor in the gate control area A, as shown by FIG. 8C, the depletion-mode GaN transistor is turned off, and only the Schottky gate-contact type GaN transistor in the active working area B works, such that self-feedback gate control is realized.

What is claimed is:

1. A GaN power semiconductor device integrated with a self-feedback gate control structure, structurally comprising: a substrate, a buffer layer, a channel layer and a barrier layer which are stacked from bottom to top, a heterojunction channel with a high electron mobility being generated between the channel layer and the barrier layer due to a polarization effect, and a gate control area and an active working area being disposed on an upper surface of the barrier layer;

wherein, in the gate control area, a first metal source electrode, a first P-type GaN cap layer, a first metal drain electrode and a second P-type GaN cap layer are sequentially arranged on the upper surface of the barrier layer at intervals, wherein a first metal gate electrode is arranged on an upper surface of the first P-type GaN cap layer, a second metal gate electrode is arranged on an upper surface of the second P-type GaN cap layer, the first metal source electrode are connected through a first resistance region, the first P-type GaN cap layer and the second P-type GaN cap layer are connected through a second resistance region, and the first metal drain electrode and the second P-type GaN cap layer are connected through a third resistance region;

in the active working area, the first metal source electrode, a third P-type GaN cap layer, a second metal drain electrode, the second P-type GaN cap layer and a second metal source electrode are sequentially arranged on the upper surface of the barrier layer at intervals, wherein a third metal gate electrode is arranged on an upper surface of the third P-type GaN cap layer, and a second metal gate electrode is arranged on an upper surface of the second P-type GaN cap layer;

the gate control area and the active working region share the first metal source electrode in the gate control area is connected with the third metal gate electrode in the active working area through a connecting metal, and the gate control area and the active working area share the second P-type GaN cap layer and the second metal gate electrode.

2. The GaN power semiconductor device integrated with the self-feedback gate control structure according to claim 1, wherein the first metal gate electrode is in Schottky contact with the first P-type GaN cap layer, the second metal gate electrode is in Schottky contact with the second P-type GaN cap layer, the third metal gate electrode is in ohmic contact with the third P-type GaN cap layer, and the first metal source electrode, the second metal source electrode, the first metal drain electrode and the second metal drain electrode are in ohmic contact with the barrier layer.

3. The GaN power semiconductor device integrated with the self-feedback gate control structure according to claim 1, wherein the first metal source electrode, the first metal gate electrode and the first metal drain electrode in the gate control area form a Schottky gate-contact type enhancement-mode GaN transistor; and the first metal source electrode, the third metal gate electrode and the second metal drain electrode in the active working area form an ohmic gate-contact type GaN transistor, and the second metal drain electrode, the second metal gate electrode and the second metal source electrode form a Schottky gate-contact type GaN transistor.

4. The GaN power semiconductor device integrated with the self-feedback gate control structure according to claim 1, wherein the first resistance region, the second resistance region and the third resistance region are one or more of a high-electron mobility resistor, a dielectric resistor and a drift-region bulk resistor formed by the heterojunction channel, and is in one or more of an S shape, a hollow-square shape and a linear shape.

5. The GaN power semiconductor device integrated with the self-feedback gate control structure according to claim 1, wherein a resistance of the first resistance region, the second resistance region and the third resistance region is regulated by changing a length-width ratio of the resistance regions; the third resistance region is configured to regulate an overall leaking current of the device and has a resistance of 1 m$\Omega$-1 k$\Omega$; and a resistance ratio of the first resistance region to the second resistance region is used to regulate a turn-on voltage of a Schottky gate-contact type enhancement-mode GaN transistor in the gate control area to decrease a gate voltage of the third metal gate electrode under a high gate voltage, thus realizing self-feedback control of a gate leakage.

6. The GaN power semiconductor device integrated with the self-feedback gate control structure according to claim 1, wherein the first metal gate electrode and the second metal gate electrode in the gate control area adopt a same process, a gate width and gate length of the first metal gate electrode are 1 μm-100 μm, and a gate length of the second metal gate electrode is 1000 μm-100000 μm.

7. The GaN power semiconductor device integrated with the self-feedback gate control structure according to claim 1, wherein a Schottky contact type depletion-mode GaN transistor is formed in the gate control area.

* * * * *